(12) United States Patent
Alacoque et al.

(10) Patent No.: US 7,274,222 B2
(45) Date of Patent: Sep. 25, 2007

(54) CONTROL METHOD FOR AN ANALOGUE SWITCH

(75) Inventors: Laurent Alacoque, Voreppe (FR);
Dominique Morche, Meylan (FR);
Marc Belleville, St Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 3 days.

(21) Appl. No.: 11/149,216

(22) Filed: Jun. 10, 2005

(65) Prior Publication Data
US 2005/0275448 A1 Dec. 15, 2005

(30) Foreign Application Priority Data
Jun. 11, 2004 (FR) .................................. 04 51266

(51) Int. Cl.
*H03K 17/00* (2006.01)
(52) U.S. Cl. ........................................ 327/94; 327/427
(58) Field of Classification Search ................. 327/91, 327/93, 94, 95, 337, 365, 387, 390, 399, 327/407, 408, 427, 589, 535, 536, 92, 96, 327/374–377, 559; 341/122, 172
See application file for complete search history.

(56) References Cited

U.S. PATENT DOCUMENTS

| | | | | |
|---|---|---|---|---|
| 5,945,872 A * | 8/1999 | Robertson et al. | ........... | 327/541 |
| 6,052,000 A * | 4/2000 | Nagaraj | ....................... | 327/94 |
| 6,072,353 A * | 6/2000 | Matsuzawa | .................. | 327/390 |
| 6,249,154 B1 * | 6/2001 | Jouffre et al. | .................. | 327/91 |
| 6,310,565 B1 * | 10/2001 | Ong et al. | ................... | 341/122 |
| 6,323,697 B1 * | 11/2001 | Pavan | .......................... | 327/94 |
| 6,518,901 B2 * | 2/2003 | Pinna et al. | ................. | 341/122 |
| 6,833,753 B2 * | 12/2004 | Das | ............................. | 327/536 |
| 6,956,411 B1 * | 10/2005 | Holloway | ..................... | 327/94 |
| 6,977,544 B2 * | 12/2005 | Nicollini et al. | ............ | 327/589 |
| 7,053,692 B2 * | 5/2006 | Parris et al. | ................. | 327/427 |
| 2005/0258874 A1 * | 11/2005 | Kudo | .......................... | 327/91 |
| 2006/0192546 A1 * | 8/2006 | Geelen | ........................ | 324/94 |

FOREIGN PATENT DOCUMENTS

| | | |
|---|---|---|
| EP | 1 168 619 A1 | 1/2002 |
| WO | WO99/13592 | 3/1999 |

OTHER PUBLICATIONS

Mikko Waltari, et al., "A Self-Calibrated Pipeline ADC with 200MHz IF Sampling Frontend", ISSCC 2002/Session 18/Converter Techniques/18.5, vol. 1, XP-010585583, 2002, 3 pages.

(Continued)

*Primary Examiner*—Kenneth B. Wells
*Assistant Examiner*—Thomas J. Hiltunen
(74) *Attorney, Agent, or Firm*—Oblon, Spivak, McClelland, Maier & Neustadt, P.C.

(57) ABSTRACT

Method for controlling an analogue switch including a transistor to which a variable analogue input voltage Vin is applied on a first terminal between a source terminal and a drain terminal of the transistor while a second terminal between the drain and the source terminal is at a variable output voltage $V_{ST}$, including the steps of: during a first phase, applying a first voltage to the transistor gate, the first voltage equal to a sum of or a difference between Vin and a first constant potential V1, and configured to make the transistor conduct; and during a second phase, applying a second voltage to the transistor gate, the second voltage equal to a sum of or a difference between $V_{ST}$, Vin and a second constant potential V2, and configured to block the transistor, the difference between the first voltage and the second voltage being constant.

40 Claims, 5 Drawing Sheets

OTHER PUBLICATIONS

M. Dessouky, et al., "Input switch configuration suitable for rail-to-rail operation of switched opamp circuits", Electronics Letters, vol. 35, No. 1. XP-002311885, Jan. 7, 1999, pp. 8-10.

Hui Pan, et al., "A 3.3V, 12b, 50MSample/s A/D Converter in 0.6μm CMOS with over 80dB SFDR", ISSCC 2000/Session 2/NYQUIST-Rate Data Converters/Paper MP 2.4, XP-010378960, Feb. 7, 2000, pp. 40-41.

Bing J. Sheu, et al., "Switch-Induced Error Voltage on a Switched Capacitor", IEEE Journal of Solid-State Circuits, vol. sc19, No. 4, Aug. 1984, pp. 519-525.

* cited by examiner

CONTROL METHOD FOR AN ANALOGUE SWITCH

TECHNICAL FIELD AND PRIOR ART

The invention relates to the field of analogue electronics and particularly a method for controlling an analogue switch to reduce the harmonic distortion error due to injection of charges.

Conventionally, in a circuit, an analogue MOS switch is put in series on the signal path, and necessarily introduces an error represented by a difference in voltage between its two terminals.

Part of this error is systematic and therefore does not depend on the signal; on the other hand, the other part is dependent on the signal and results in a deformation of the signal that has to be kept at the lowest possible level.

This signal deformation is quantified by its harmonic distortion.

There are two possible ways of reducing this distortion: either reduce the absolute value of the error, or linearise the error, in other words reduce the part that depends on the signal, even if the absolute value of the error is increased.

Analogue switches made using the MOS technology suffer from various limitations:
- their resistance in the conducting state is not zero and it depends on a number of technological and design parameters;
- transitions from the conducting state to the blocked state induce a leak of channel charges, known as charge injection.

These two phenomena contribute to reducing the performances of analogue circuits, especially in the case of circuits with switched capacitors in which the signal is represented in the form of charges.

For high precision converters, these two error types become the limiting factor in the resolution and harmonic distortion.

The document by Bing J. Sheu and Chenming Hu, entitled "Switch-induced error voltage on a switched capacitor", IEEE. Journal of Solid-State circuits, SC-19(4), 1984, provides a physical explanation and an analytic expression for charge errors observed during injection of charges in a transistor used in an analogue switch.

The charge injection phenomenon is seen as a superposition of two phenomena:
- the charge of the switch transistor channel is evacuated in the drain and the source (the substrate has almost no influence considering its higher time constant). This error is proportional to the charge stored in the channel and therefore to its surface area (defined by its width and length, W and L) and the gate voltage Vg.
- a clock part applied on the gate is injected into the switch transistor drain through gate/drain overlap capacitors and through the gate/channel junction capacitor as long as the channel is formed.

This error is proportional to W and to the clock speed, and is called "clock feedthrough".

As technological developments continue, the reduction in the thickness of the gate oxide, the reduction in the power supply voltage and the increase in the speed of clock fronts have made this charge injection error preponderant.

This has led to the creation of new switches with much more complex schemes, particularly for input switches onto which a large proportion of the constraints are transferred.

The conductance (and therefore the dimensions) of input switches is based both on the maximum value of the input signal and on its frequency, unlike internal switches for which the conductance is based solely on the maximum value of the signal.

The techniques envisaged include "clock doubling", that doubles the value of the clock voltage to attenuate the end of charge error by increasing the conductance of the input switches.

The block diagram for a switch 1 controlled by a signal in "clock doubling" is shown in FIG. 1.

This type of device uses capacitors 2, 4.

During a first phase, these two capacitors are charged to Vdd by closing switches 6, 8 and 12.

During a second phase, the lower armature of one of the capacitors is connected to the upper armature of the other by closing the switch 10, thus forming a series capacitor charged to voltage 2 Vdd.

The transistor 1 can thus be controlled with a voltage 2 Vdd through a switch 14.

Although this technique is efficient, it is stressing for the transistor 1. It introduces a Gate—Source voltages effect with value 2 Vdd and can therefore deteriorate the gate oxide in the transistor 1.

Therefore, the Clock Boosting technique described by M. Dessouky and A. Kaiser in "Input switch configuration for suitable rail-to-rail operation of switched opamps circuits", IEE Electronic Letters, 35(1), 1999, will be preferred, wherein the gate-source voltage is fixed at Vdd regardless of the signal voltage, will be preferred.

The principle of Clock boosting is shown in FIG. 2.

A capacitor 20 is charged during a first phase (by closing the switches 24 and 26) and is applied to the gate/source terminals of a transistor 22 during a second phase (by closing switches 32 and 34) during which it acts like a battery. The transistor 28 is closed during the first phase: the gate of transistor 22 is at GND.

This technique can significantly improve the performances of an input switch; the harmonic distortion is reduced by a factor of ten to one hundred compared with conventional solutions based on switches with complementary polarities (CMOS).

However, the performances of these switches are not satisfactory with regard to the required linearity, particularly for telecommunication applications made using switched capacitors.

Therefore, the problem arises of producing a method and device for controlling an analogue switch with low harmonic distortion.

PRESENTATION OF THE INVENTION

The proposed invention enables to reduce the harmonic distortion introduced by an analogue switch, particularly using a transistor, for example of the MOS type.

The purpose of the invention is a method for controlling an analogue switch comprising a transistor to which an input voltage Vin is applied, wherein:
- during a first phase, a first voltage, function of Vin and of a first potential V1, and that can put the transistor in a conducting state, is applied to the transistor gate,
- during a second phase, a second voltage, function of Vin and of a second potential V2, and that can put the transistor in a blocked state, is applied to the transistor gate, the difference between the first voltage and the second voltage being independent of Vin.

According to a first alternative of the method, wherein the transistor is an N type transistor, the first voltage can be equal to Vin+V1, while the second voltage can be equal to Vin+V2.

According to a second alternative of the method, wherein the transistor is a P type transistor, the first voltage can be equal to Vin−V1, while the second voltage can be equal to Vin−V2.

The potentials V1 and V2 can be constant or fixed potentials.

The first potential V1 can be higher than the transistor threshold voltage. The first potential V1 can be a positive potential.

The second potential V2 can be lower than the transistor threshold voltage. According to a possibility of implementation, the first potential V1 and the second potential V2 can be equal in absolute value or can be such as V1=−V2.

According to an alternative, the first potential and the second potential can be equal in absolute value to a potential or voltage Vdd or can be such as V1=−V2=Vdd. Such an alternative can enable to maximize the conductance of the transistor in the ON state and to minimize the leakages of the transistor in the OFF state. The voltage Vdd can be a biasing voltage or a maximum voltage authorized by the transistor technology. The voltage Vdd can be higher than the threshold voltage of the transistor.

Another purpose of the invention is a method for controlling an analogue switch comprising a transistor to which an input voltage Vin is applied, wherein a clock signal, or a gate or control signal is applied to the transistor, that is symmetric with the input voltage.

The invention uses a method for controlling an analogue switch comprising a transistor, to which an input voltage vin is applied, wherein:

a first voltage, Vin+Vdd, is applied to the transistor gate during a first phase, a second voltage, Vin−Vdd symmetric of the first voltage in relation with, or compared to the input voltage Vin, is applied to the transistor gate during a second phase.

According to the invention, this error is made as independent from the signal Vin as possible to reduce harmonic distortion due to the charge injection error.

The first voltage Vin+Vdd may be applied during the first phase by application of a first capacitor charged to Vdd between the gate and an input voltage Vin or a node at potential Vin.

The second voltage Vin−Vdd may be applied during the second phase by application of a second capacitor charged to −Vdd between the gate and the input voltage Vin; or a node at potential Vin, or the output voltage $V_{ST}$.

The second capacitor can be recharged during the first phase, the first capacitor recharging during the second phase.

The first voltage may be applied by switching at least one switch.

The second voltage may be applied by switching at least one switch.

The first capacitor may be charged from a voltage source Vdd from which it is isolated, during discharge, through a transistor for which the gate is connected to the gate of the analogue switch transistor.

This transistor may be in the blocked state when the gate of the analogue switch transistor is in the high state and in the conducting state when the gate of the analogue switch transistor is in the low state.

The second voltage is preferably applied through a transistor with a floating body or with n wells (n>2).

The second capacitor may be connected to the ground from which it is isolated, during discharge through a transistor, the gate of which is connected to the gate of the analogue switch transistor.

The transistor may be in the blocked state when the gate of the analogue switch transistor is in the low state and in the conducting state when the gate of the analogue switch transistor is in the high state.

The invention also relates to a device for controlling an analogue switch comprising a transistor, this control device comprising:

means for applying an input voltage Vin to the transistor, means for applying a first voltage to the transistor gate during a first phase, first voltage being dependent on or function of vin and of a first potential V1, and being able to put the transistor in a conducting state, means for applying a second voltage to the transistor gate during a second phase, second voltage being dependent on or function of Vin and of a second potential V2, and being able to put the transistor in a blocked state, the difference between the first voltage and the second voltage being independent of Vin.

According to a first alternative of the method wherein the transistor is an N type transistor, the first voltage can be equal to Vin+V1, while the second voltage, can be equal to Vin+V2.

According to a second alternative of the method wherein the transistor is a P type transistor, the first voltage can be equal to Vin−V1, while the second voltage can be equal to Vin−V2.

The potentials V1 and V2 can be constant potentials or fixed potentials.

First potential V1 can be higher than the transistor threshold voltage. First potential V1 can be a positive potential.

Second potential V2 can be lower than the transistor threshold voltage. According to a possibility of implementation, the first potential V1 and the second potential V2 can be equal in absolute value or can be such as V1=−V2.

According to a variant, the first potential and the second potential can be equal in absolute value to a voltage Vdd or can be such as V1=−V2=Vdd. Such a variant can enable to maximize the conductance of the transistor in the ON state and to minimize the leakages of the transistor in the OFF state. The voltage Vdd can be a biasing voltage or a maximum voltage authorized by the transistor technology. The voltage Vdd can be higher than the threshold voltage of the transistor.

The invention also relates to a control device for an analogue switch comprising a transistor, this control device comprising:

means for applying an input voltage Vin, means for applying a first voltage, Vin+Vdd, to the transistor gate during a first phase, means for applying a second voltage Vin−Vdd symmetric of the first voltage in relation to the input voltage Vin, to the transistor gate during a second phase.

A first capacitor can be used to apply a first voltage Vin+Vdd during the first phase, between the gate and the input voltage Vin.

A second capacitor can be used to apply the second voltage Vin−Vdd between the gate and the input voltage Vin, or the output voltage $V_{ST}$, during the second phase.

Means can be used to recharge the second capacitor during the first phase, and other means can be used to recharge the first capacitor during the second phase.

Advantageously, the device comprises at least one switch to apply the first voltage.

It may also comprise at least one switch to apply the second voltage.

According to one embodiment, it comprises a voltage source Vdd to charge the first capacitor and means for isolating the voltage source from the first capacitor during discharge.

Means for isolating the voltage source from the first capacitor during discharge may be provided.

For example, these means include a transistor for which the gate is connected to the gate of the analogue switch transistor.

The said transistor may be in the blocked state when the gate of the analogue switch transistor is in the high state and in the conducting state when the gate of the analogue switch transistor is in the low state.

Advantageously, a transistor with a floating body or with n (n>2) wells can be used to apply the second voltage.

During discharge, the second capacitor may be connected to the ground from which it is isolated through a transistor, the gate of which is connected to the gate of the analogue switch transistor.

The said transistor may be in the blocked state when the gate of the analogue switch transistor is in the low state, and in the conducting state when the gate of the analogue switch transistor is in the high state.

DETAILED PRESENTATION OF PARTICULAR EMBODIMENTS

Figure 1:
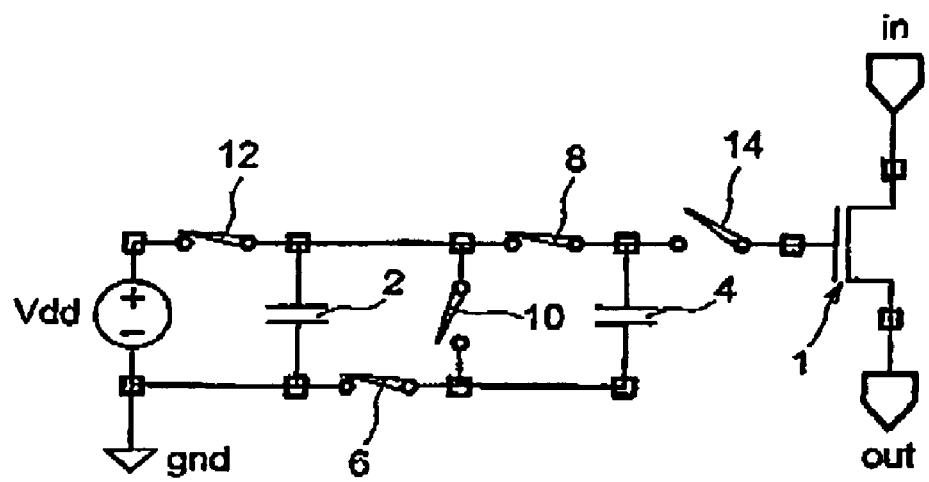
FIGS. 1 and 2 show devices according to prior art.
Figure 2:
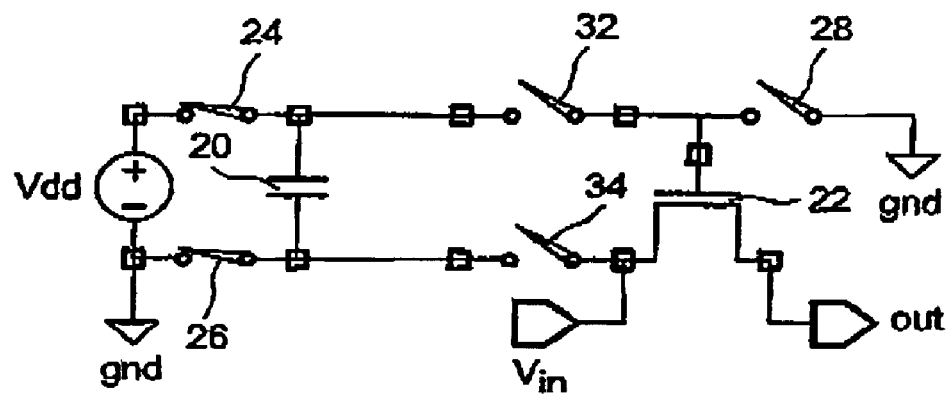
Figure 3:
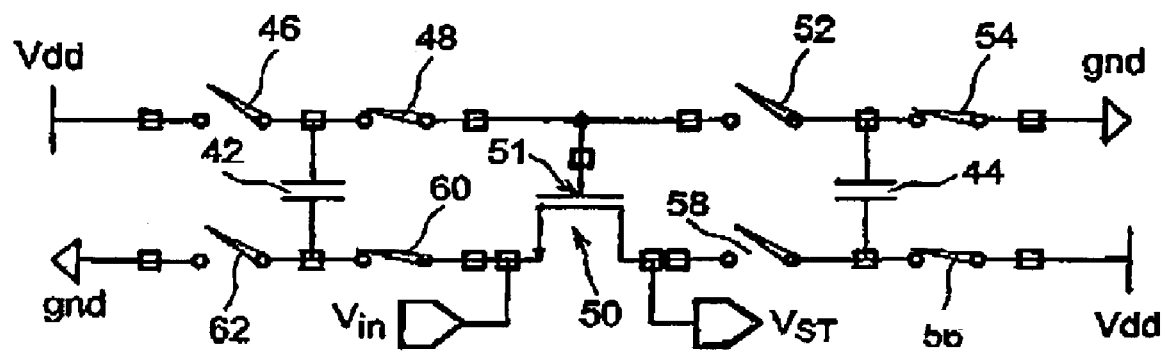
FIG. 3 shows a diagram of a device according to the invention.

FIG. 3 shows an example of a circuit according to the invention.

This circuit improves the linearity of switches despite the charge injection error, due to a new clock principle that is more symmetric with respect to the signal.

According to the invention, one applies to the gate of transistor 50, particularly a MOS type transistor, during a first phase: a first voltage, dependent on Vin and on a first potential V1, the first voltage being able to put the transistor in a conducting state. During a second phase, a second voltage, dependent on Vin and on a second potential V2, and that can put the transistor in a blocked state, is applied to the transistor gate, the difference between the first voltage and the second voltage being independent of Vin. The charge injection in the transistor can be thus made more independent from the entrance signal Vin. The potentials V1 and V2 can be constant potentials or fixed potentials.

First potential V1 and second potential V2 can be fixed or constant potentials.

The transistor 50 can be, for instance, an N type transistor. The first voltage can be equal to Vin+V1, while second voltage can be equal to Vin+V2.

The first potential V1 can be higher than the transistor threshold voltage. The first potential V1 can also be a positive potential. The second potential V2 can be lower than the transistor threshold voltage.

According to a possibility of implementation, the first potential V1 and the second potential V2 can be equal in absolute value or can be such as V1=−V2.

According to a variant, the first potential and the second potential can be equal in absolute value to a voltage Vdd or can be such as V1=−V2=Vdd. The voltage Vdd can be a bias voltage or a maximum voltage authorized by the transistor technology. The voltage Vdd can be higher than the threshold voltage of the transistor.

According to this variant, during a first phase then during a second phase, one applies to the gate of the transistor 50, for example of NMOS type, symmetrical voltages compared to an input voltage Vin of a switch transistor.

For example, the input voltage Vin originates from a microphone, an ADSL type telephone line or a radio-frequency reception system.

A voltage equal to Vin+Vdd is applied during a first phase or "ON" state, and a voltage equal to Vin−Vdd is applied during a second phase or "OFF" state.

This makes the charge injection error practically independent of the value of the signal, thus reducing the harmonic distortion.

During the first phase, a capacitor 42 initially charged to Vdd (by closing switches 46 and 62) is applied between the gate 51 of the transistor 50 and Vin (by closing switches 48 and 60).

A voltage equal to Vdd+Vin is then applied to this gate 51.

During the same phase, a second capacitor 44 is recharged to voltage −Vdd (by closing switches 54 and 56).

The first capacitor is recharged during a second phase (switches 48 and 60 are open and switches 46 and 62 are closed), while the capacitor 44 is applied between the gate and the drain of the transistor 50, but with the sign of the voltage being opposite to the first capacitor. As a variant, the capacitor could be applied between the gate and the source of transistor 50. At the end of the charge, the source and drain are at the same potential (Vin=$V_{ST}$).

The effect is to apply a voltage Vin−Vdd to the gate of transistor 51.

Figure 4A:
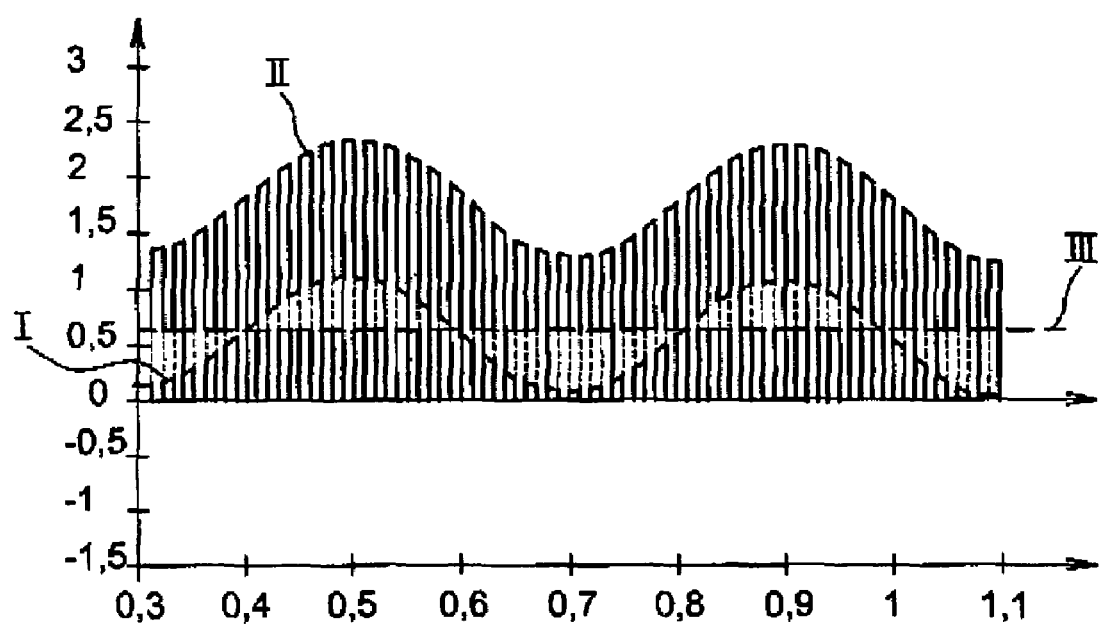
FIG. 4 shows a comparison between a known method and a method according to the invention.
Figure 4B:
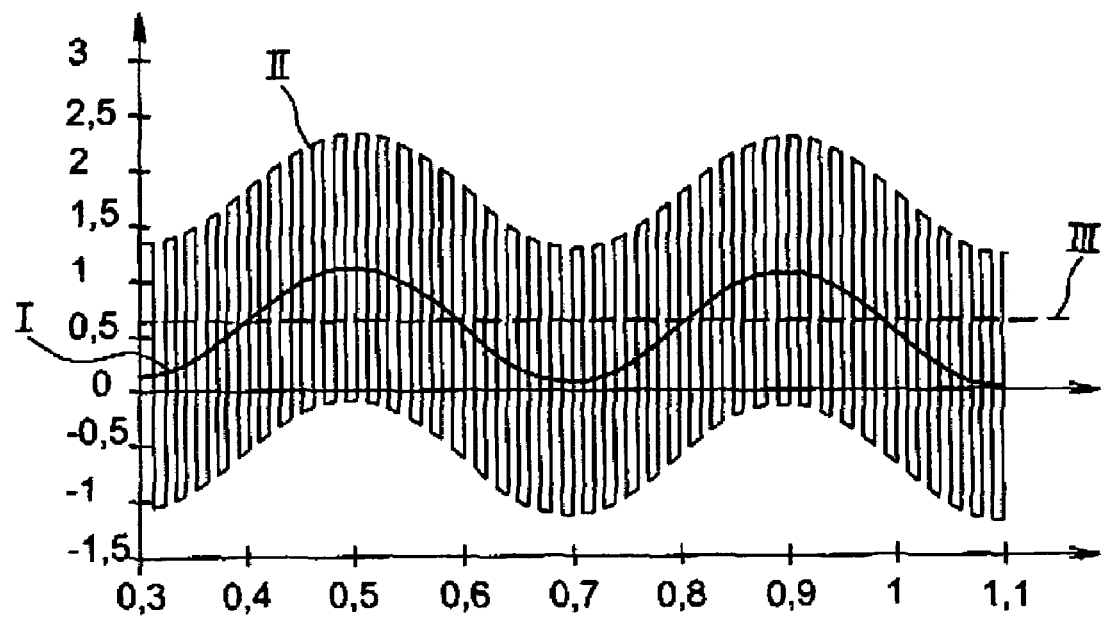

FIGS. 4A and 4B show several charge and discharge cycles of a capacitor by an analogue switch using a sinusoidal signal, the graph at the bottom (FIG. 4B) corresponding to a symmetric case according to the invention, and the graph at the top (FIG. 4A) corresponding to the known clock boosting case.

The input signal (Curve I), the output signal (between curve I and the horizontal line III) and the control signal (or gate signal—curve II) are shown on each graph.

The bottom graph shows the gate signal that is perfectly symmetric compared to or in relation with the input signal I and the output signal, and that can have a frequency of up to a few hundred MegaHertz.

Figure 5:
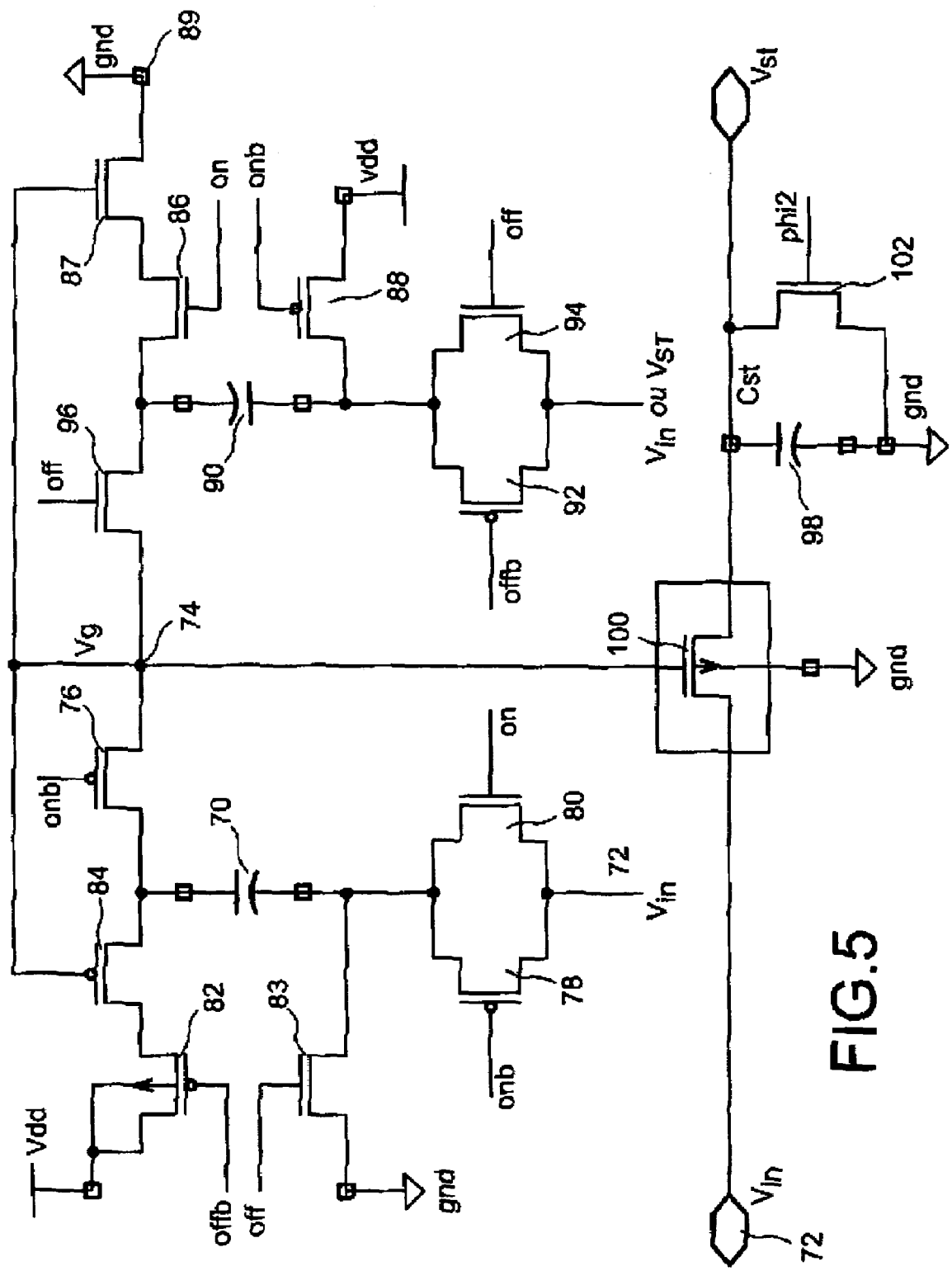
FIG. 5 shows an embodiment of a device according to the invention.

FIG. 5 shows a detailed embodiment of a circuit according to the invention.

This circuit can be used to generate clocks of up to +2Vdd and −Vdd starting from the power supply of dd.

The following describes operation of this circuit.

During a first phase, or an "ON" phase, a capacitor 70 initially charged to Vdd is applied between the input 72 and the gate 74 through transistors 76 and 78, 80 that form a switch consisting of MOS structures with complementary polarities.

The negative armature of the capacitor 70 is connected to the input 72 (at voltage Vin), and its positive armature is connected to the gate 74. Therefore, the gate signal increases to a voltage V=Vin+Vdd.

At this moment, the transistor 82 that can be used with the transistor 83 to charge the capacitor 90 to Vdd, could start conducting because its source voltage becomes greater than its gate voltage.

The result would be that the gate signal would discharge into the voltage source Vdd.

To prevent this, a transistor 84 is put in series on this node.

This transistor, for which the gate is connected to the gate 74 can isolate the voltage source at Vdd from the gate 74 when the gate is in the high state. It is conducting when the gate 74 is in the low state.

Also during the first phase, the transistors 86 and 88 charge the capacitor 90 to a voltage Vdd.

All other transistors are in the high impedance state.

At the end of this first phase, the transistors 76 and 78, 80 are cut off and thus isolate the capacitor from the gate 74.

At the beginning of the second phase, or in "OFF" state, the transistors 92, 94 become conducting and connect the positive armature of the capacitor 90 to the Vin signal.

This armature can also be connected to the Vst signal since the voltages Vin and Vst at the end of the charge (end of "ON" state) are the same.

When the gate voltage (74) drops below level 0, the transistor 86 can have a positive gate—source voltage, start to conduct and thus discharge the capacitor 90 to the ground.

To prevent this, a transistor 87 is used in series on the ground 89—gate 74 path for which the gate is connected to the gate 74. This transistor is blocked and isolates the ground 89 from the gate 74 when the gate is in the low state, and is transparent when it is in the high state.

Still during the "OFF" state, the transistors 82 and 83 are conducting to recharge charge losses in the capacitor 70. The transistors 96 and 92, 94 are cut off at the end of the "OFF" phase, thus isolating the capacitor 90 from the gate 74.

The negative armature of the capacitor 90 is connected to the gate 74 through the transistor 96. Therefore, the signal of the gate 74 drops to voltage V'=Vin−Vdd (or Vst−Vdd).

This voltage may be close to −Vdd if vin is close to 0; in this case, the source/substrate diode of transistor 96 can be connected directly, which prevents the node 74 from dropping below $V_{diode}$.

SOI technologies can solve this problem due to the complete isolation of the body and therefore make this generation of negative control voltages possible. In particular, a floating body transistor 96 is used.

Other technologies such as triple well technologies may also be used.

Figure 7:
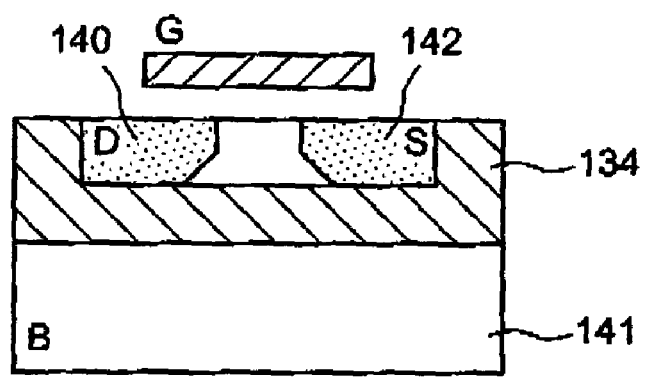
Figure 8:
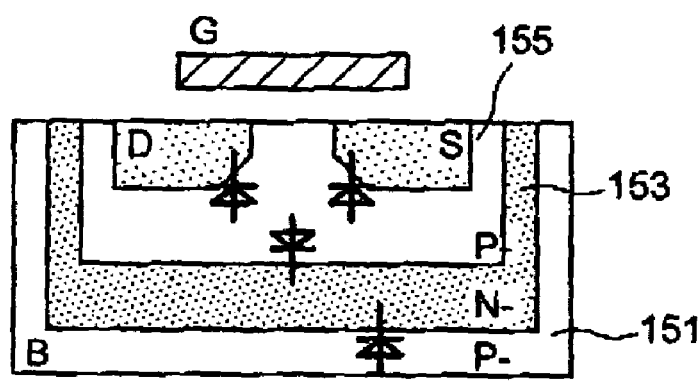

FIGS. 7 and 8 illustrate the source/substrate isolation principle for SOI and triple well technologies respectively.

Figure 6:
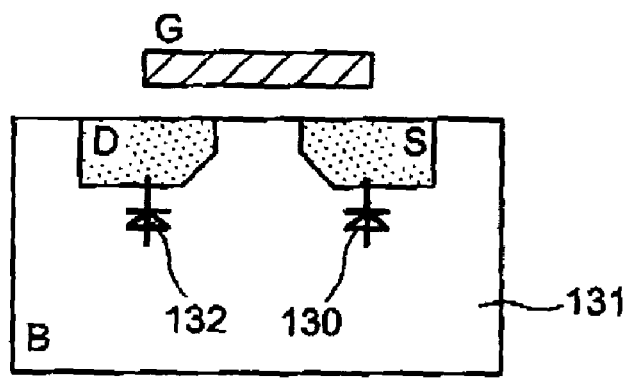
FIGS. 6-8 show silicon wafers made using a standard, SOI and triple well technology, FIGS. 9A-9C summarise different clock principles.

In FIGS. 6-8, three N type MOS transistors are shown in a cross-sectional view for the standard technology (FIG. 6), the SOI technology (FIG. 7) and the triple well technology (FIG. 8).

In the standard technology (FIG. 6), a substrate/drain diode 130 and a substrate/source diode 132 are used.

Since the substrate 131 is connected to the ground, any voltage less than the ground minus a diode threshold will make one of these diodes conducting.

This problem is solved using SOI technology (FIG. 7) in which an insulator 134 separates the substrate 141 from the drain 140 and the source 142.

Triple well technologies (FIG. 8) also compensate for the problem by an N-doped external well 153 (in a P-substrate 151).

This external well contains another P-doped well 155 for the construction of an N type MOS.

This construction can be used to obtain a well/substrate inverse diode that prevents a negative voltage from being transferred to the ground of the substrate.

Figure 9A:
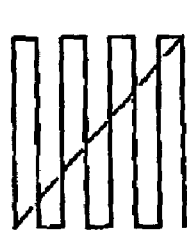
Figure 9B:
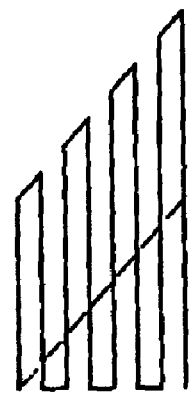
Figure 9C:
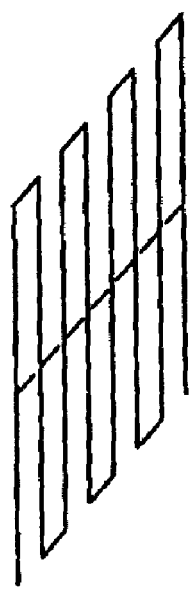

FIGS. 9A-9C summarise the different principles of the gate voltage of the switch transistor: from left to right, the figures show the principle of a standard gate voltage (FIG. 9A), a gate voltage with clock boosting (FIG. 5B) and finally a gate voltage with symmetric clock boosting (FIG. 5C). The voltage Vin is shown in dashed lines. The signal or gate voltage or control voltage forms the clock signal.

Figure 10:
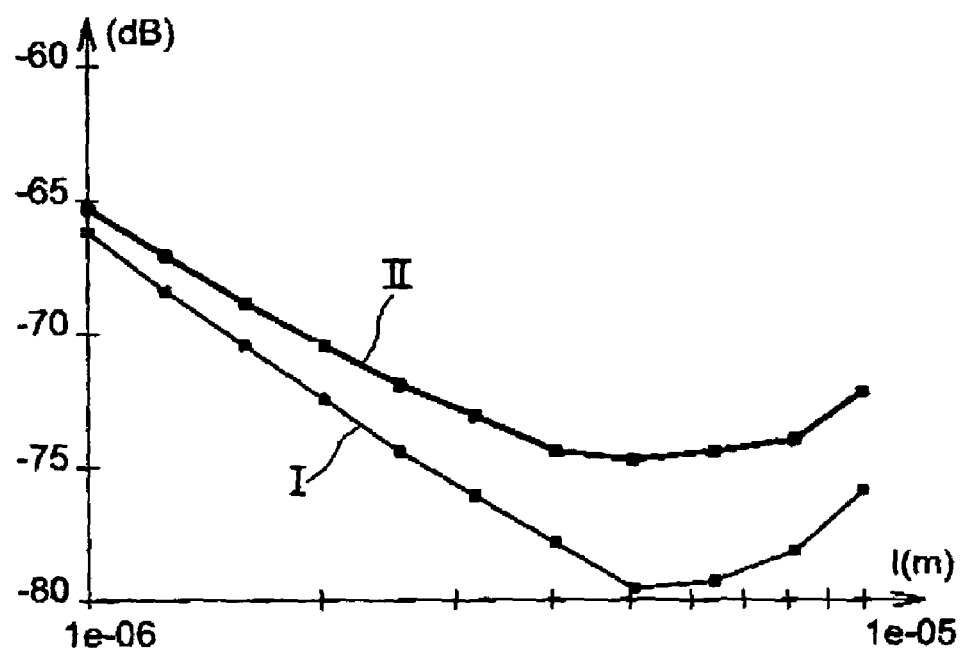
FIG. 10 shows the result of a simulation for a method according to the invention.

FIG. 10 shows the results of a simulation for a method according to the invention in symmetric clock boosting (curve I) and non-symmetric clock boosting (curve II) respectively.

The harmonic distortion of a transistor N installed as an input switch is plotted as a function of its width W.

The results show that the symmetric technique is better than the non-symmetric technique, regardless of the transistor width.

The minimum distortion is also better, by about 10 dB.

The invention improves the linearity of analogue switches and therefore improves the performances of these components used in many fields, particularly including telecommunication applications, analogue digital converters and circuits with switched capacitors.

The invention provides a new solution for the charge injection error that will become more and more widespread with the reduction in gate oxide and power supply voltages.

It is particularly applicable to isolated SOI type technologies used to make floating body transistors, as explained above, particularly for the transistor 96.

The invention is not limited to a method for controlling N type transistors and can be applied to P type transistors, in particular to PMOS type transistors. In this case, one can apply to the gate of a PMOS transistor, during a first phase, a first voltage Vin−V1, that can make the transistor conduct, then, during a second phase, a second voltage Vin−V2, the second tension being able to block the aforementioned transistor, the difference between the first voltage and the second voltage being independent from the input voltage Vin.

The invention claimed is:

1. Method for controlling an analogue switch comprising a transistor to which a variable analogue input voltage Vin is applied, on a first terminal between a source terminal and a drain terminal of said transistor while a second terminal between said drain and said source terminal is at a variable output voltage $V_{ST}$, comprising the steps of:
   during a first phase, applying a first voltage to the transistor gate, the first voltage equal to a sum of or a difference between Vin and a first constant potential V1, and configured to make said transistor conduct,
   during a second phase, applying a second voltage to the transistor gate, the second voltage equal to a sum of or a difference between $V_{ST}$ and a second constant potential V2, and configured to block said transistor, the difference between the first voltage and the second voltage being constant.

2. Method for controlling an analogue switch according to claim 1, wherein said transistor is a P type transistor, the first voltage is equal to Vin −V1, and the second voltage is equal to $V_{ST}$−V2.

3. Method for controlling an analogue switch according to claim 1, wherein said transistor is an N type transistor, the first voltage is equal to Vin+V1, and the second voltage is equal to $V_{ST}$+V2.

4. Method for controlling an analogue switch according to claim 2, wherein V1 is equal to −V2.

5. Method for controlling an analogue switch according to claim 3, wherein V1−V2.

6. Method for controlling an analogue switch according to claim 2, wherein V1 and −V2 are equal to a bias voltage Vdd.

7. Method for controlling an analogue switch according to claim 3. wherein V1 and −V2 are equal to a bias voltage Vdd.

8. Method for controlling an analogue switch according to any one of claims 1 to 7, wherein $V_{ST}$ is equal to Vin, and the difference between the first voltage and the second voltage is independent of Vin.

9. Method for controlling an analogue switch including a transistor to which a variable analogue input voltage Vin is applied on a first terminal between a source terminal and a drain terminal of said transistor while a second terminal between said drain and said source terminal is at a variable voltage $V_{ST}$, comprising the steps of:
during a first phase, applying a first voltage Vin+Vdd to the transistor gate, during a second phase, applying a second voltage $V_{ST}$−Vdd to the transistor gate, the difference between the first voltage and the second voltage being constant.

10. Method according to claim 9, wherein the first voltage Vin+Vdd is applied during the first chase by applying a first capacitor charged to Vdd between the gate and a node at potential Vin.

11. Method according to claim 10, wherein the second voltage $V_{ST}$−Vdd is applied during the second phase by a second capacitor charged to −Vdd between the gate and a node at potential Vin, or between the gate and the output voltage $V_{ST}$.

12. Method according to claim 11, wherein the second capacitor recharges during the first phase, and the first capacitor recharges during the second phase.

13. Method according to claim 10, wherein the first capacitor is charged from a voltage source Vdd, the first capacitor is isolated from the voltage source Vdd during discharge through a transistor, and the gate of the transistor is connected to the gate of the analogue switch transistor.

14. Method according to claim 13, wherein the transistor is in the blocked state when the gate of the analogue switch transistor is in the high state, and in the conducting state when the gate of the analogue switch transistor is in the low state.

15. Method according to claim 9, wherein the second voltage is applied through a transistor with a floating body or with n wells (n>2).

16. Method according to claim 11, wherein the second capacitor is connected to the ground from which it is isolated during discharge through a transistor, and the gate of the transistor is connected to the gate of the analogue switch transistor.

17. Method according to claim 16, wherein the transistor is in the blocked state when the gate of the analogue switch transistor is in the low state and in the conducting state when the gate of the analogue switch transistor is in the high state.

18. Method according to claim 9, wherein the first voltage is applied by switching at least one switch.

19. Device according to claim 9, wherein the second voltage is applied by switching at least one switch.

20. Method according to any one of claims 9 to 16 and 17 to 19, wherein the output voltage $V_{ST}$ is equal to Vin, and the difference between the first voltage and the second voltage is independent of Vin.

21. Device for controlling an analogue switch Vdd including a transistor, the device comprising:
means for applying a first voltage to the transistor gate during a first phase, the first voltage equal to a sum or a difference between (a) a variable analogue input voltage Vin applied on a first terminal chosen between a source terminal and a drain terminal of said switch transistor of the transistor and (b) a first constant potential V1, wherein the first voltage is configured to put the transistor in a conducting state,
means for applying a second voltage to the transistor gate during a second phase, the second voltage equal to a sum or a difference between (a) a variable output voltage $V_{ST}$ at a second terminal chosen between said drains and said source terminals of said switch transistor and (b) a second constant potential V2, wherein the second voltage is configured to put the transistor in a blocked state, and the difference between the first voltage and the second voltage is constant.

22. Device according to claim 21, wherein said transistor is a P type transistor, and the first voltage is equal to Vin−V1 while the second voltage is equal to $V_{ST}$−V2.

23. Device according to claim 21, wherein said transistor is an N type transistor, and the first voltage is equal to Vin+V1 while the second voltage is equal to Vin+V2.

24. Device for controlling an analogue switch according to claim 22 or 23, wherein V1 is equal to −V2.

25. Device for controlling an analogue switch according to claim 22 or 23, wherein V1 and −V2 are equal to a bias potential Vdd.

26. Device according to any one of claims 21 to 23, wherein the output voltage $V_{ST}$ is equal to Vin, and the difference between the first voltage and the second voltage is independent of Vin.

27. Device for controlling an analogue switch including a transistor, the device comprising:
means for applying to the transistor gate during a first phase, a first voltage Vin+Vdd, wherein Vin is a variable analogue input voltage applied on a first terminal between a source terminal and a drain terminal of said switch transistor and Vdd is a bias voltage of the transistor,
means for applying to the transistor gate during a second phase, a second voltage $V_{ST}$−Vdd, wherein $V_{ST}$ is a variable output voltage on a second terminal between said source terminal and said drain terminal of said switch transistor, and the difference between the second voltage and the first voltage is constant.

28. Device according to claim 27, further comprising:
a first capacitor configured to apply the first voltage Vin+Vdd during the first phase between the gate and an input voltage Vin.

29. Device according claim 28, further comprising:
a second capacitor configured to apply a second voltage $V_{ST}$−Vdd during the second phase between the gate and an output voltage $V_{ST}$.

30. Device according to claim 29, further comprising:
means for recharging the second capacitor during first phase; and
means for recharging the first capacitor during the second phase.

31. Device according to claim 28, further comprising:
a voltage source Vdd configured to charge the first capacitor; and
means for isolating the voltage source from the first capacitor during discharge.

32. Device according to claim 31, further comprising:
means for isolating the voltage source from the first capacitor during discharge.

33. Device according to claim 32, wherein the means for isolating includes a transistor, and the gate of the transistor is connected to the gate of the analogue switch transistor.

34. Device according to claim 31, wherein said transistor is in the blocked state when the gate of the analogue switch transistor is in the high state, and in the conducting state when the gate of the analogue switch transistor is in the low state.

35. Device according to claim 28, wherein the second capacitor is connected to the ground, from which it is isolated during discharge, through a transistor, and the gate of the transistor is connected to the gate of the analogue switch transistor.

36. Device according to claim 35, wherein the transistor is in the blocked state when the gate of the analogue switch transistor is in the low state, and in the conducting state when the gate of the analogue switch transistor is in the high state.

37. Device according to claim 27, further comprising:
at least one switch configured to apply the first voltage.

38. Device according to claim 27, further comprising:
at least one switch configured to apply the second voltage.

39. Device according claim 27, further comprising:
a transistor with a floating body or with n (n>2) wells configured to apply the second voltage.

40. Device according to any one of claims 27 to 37, wherein the output voltage $V_{ST}$ is equal to Vin, and the difference between the first voltage and the second voltage is independent of Vin.

* * * * *